(12) United States Patent
Streibl et al.

(10) Patent No.: US 7,864,907 B2
(45) Date of Patent: Jan. 4, 2011

(54) DATA RECEIVER WITH CLOCK RECOVERY CIRCUIT

(75) Inventors: Martin Streibl, Petershausen (DE); Peter Gregorius, Munich (DE); Thomas Rickes, Munich (DE); Ralf Schledz, Zolling (DE)

(73) Assignee: Qimonda AG, Munich (DE)

( * ) Notice: Subject to any disclaimer, the term of this patent is extended or adjusted under 35 U.S.C. 154(b) by 880 days.

(21) Appl. No.: 11/742,577

(22) Filed: Apr. 30, 2007

(65) Prior Publication Data
US 2007/0258552 A1 Nov. 8, 2007

(30) Foreign Application Priority Data
Apr. 29, 2006 (DE) ........................ 10 2006 020 107

(51) Int. Cl.
*H04L 7/00* (2006.01)
(52) U.S. Cl. ...................................... 375/355
(58) Field of Classification Search ................. 375/355, 375/354; 341/155; 327/91, 94; 345/3, 123, 345/204
See application file for complete search history.

(56) References Cited

U.S. PATENT DOCUMENTS

| | | | |
|---|---|---|---|
| 4,821,297 | A | 4/1989 | Bergmann et al. |
| 6,442,091 | B2 | 8/2002 | Verbeck |
| 6,466,500 | B2 | 10/2002 | Wicht et al. |
| 7,173,993 | B2 | 2/2007 | Engl et al. |
| 7,184,502 | B2 | 2/2007 | Engl et al. |
| 2001/0038564 | A1 | 11/2001 | Verbeck |
| 2001/0043119 | A1 | 11/2001 | Wicht et al. |
| 2003/0122600 | A1 | 7/2003 | Engl et al. |
| 2003/0142770 | A1 | 7/2003 | Engl et al. |
| 2003/0161430 | A1 | 8/2003 | Sou |
| 2004/0202266 | A1 | 10/2004 | Gregorius et al. |
| 2006/0044171 | A1* | 3/2006 | Noguchi .................... 341/155 |
| 2006/0056558 | A1* | 3/2006 | Chou et al. ................ 375/355 |
| 2006/0197692 | A1* | 9/2006 | Gong et al. ................ 341/155 |

FOREIGN PATENT DOCUMENTS

| | | |
|---|---|---|
| DE | 10023362 C2 | 10/2002 |
| DE | 10157437 A1 | 6/2003 |

(Continued)

OTHER PUBLICATIONS

Mark Horowitz et al., "High-Speed Electrical Signaling: Overview and Limitations", IEEE Micro, vol. 18, Issue 1, pp. 12-24, Jan./Feb. 1998.

*Primary Examiner*—Khai Tran
(74) *Attorney, Agent, or Firm*—Patterson & Sheridan, LLP (57) ABSTRACT

A data receiver has a sampling unit connected to a data signal input and configured to sample a data signal amplitude and amplify the sampled data signal amplitude to a predetermined value, a sampling clock generator unit connected to the sampling unit and configured to predetermine a sampling clock for the sampling unit, an evaluation unit connected to the sampling unit and configured to determine the time duration required by the sampling unit for amplifying the sampled data signal amplitude to the predetermined value and evaluate the time duration determined, and a control unit connected to the evaluation unit and the sampling clock generator and configured to define the sampling clock on the basis of the evaluation of the time duration determined by the evaluation unit.

24 Claims, 6 Drawing Sheets

FOREIGN PATENT DOCUMENTS

| | | |
|---|---|---|
| DE | 10203596 C1 | 8/2003 |
| DE | 10301130 A1 | 9/2003 |
| DE | 102004014695 A1 | 11/2004 |
| DE | 19844968 B4 | 11/2005 |
| EP | 1148509 A1 | 10/2001 |

* cited by examiner

DATA RECEIVER WITH CLOCK RECOVERY CIRCUIT

CROSS-REFERENCE TO RELATED APPLICATIONS

This application claims foreign priority benefits under 35 U.S.C. §119 to co-pending German patent application number DE 10 2006 020 107.8, filed 29 Apr. 2006. This related patent application is herein incorporated by reference in its entirety.

BRIEF DESCRIPTION OF THE DRAWINGS

The features of embodiments will become clear from the following description, taking in conjunction with the accompanying drawings. It is to be noted, however, that the accompanying drawings illustrate only typical embodiments and are, therefore, not to be considered limiting of the scope of the invention. It may admit other equally effective embodiments.

DETAILED DESCRIPTION OF THE PREFERRED EMBODIMENT

Figure 1:
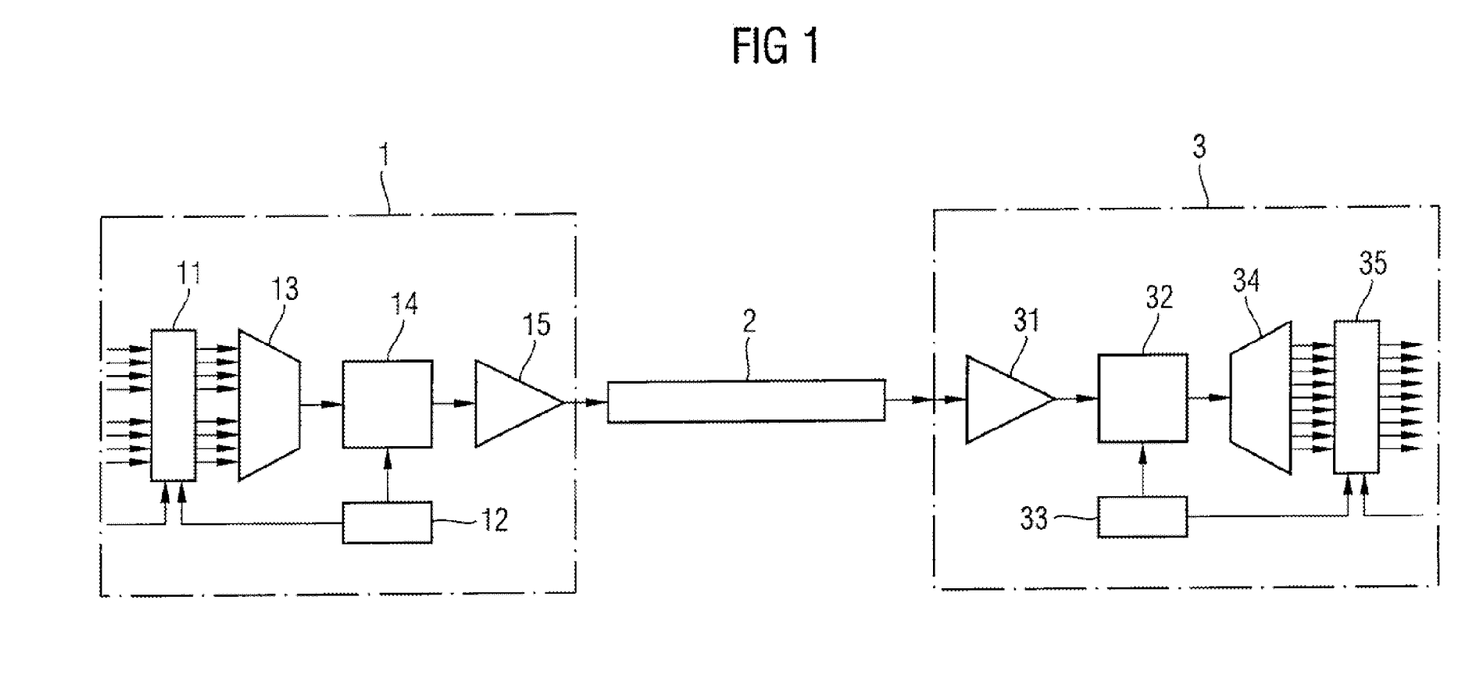
FIG. 1 schematically shows the construction of a serial data transmission system.

Advances in the production of integrated circuits have led to an exponential rise in the data transmission speed. Thus, data transmission rates in the gigabits range per second and data transmission channel occur in particular in semiconductor memories as well. FIG. 1 shows a serial digital data transmission system such as is used for data transmission between integrated circuits in semiconductor memories. What is characteristic of the serial data transmission is that the data signals are transmitted from a data transmitter 1 via a data line 2 temporally successively, i.e. bit-serially, to a data receiver 3.

Since the integrated circuits in the semiconductor memories generally process the data in parallel, a parallel-serial conversion is effected in the data transmitter 1 and a serial-parallel conversion is effected in the data receiver 3. For this purpose, as shown in FIG. 1, the data transmitter 1 has a so-called FIFO register 11, which may be realized e.g. by a series of shift registers connected in parallel. The FIFO register 11 shown in FIG. 1 has, for example, in each case eight data inputs and outputs. The FIFO register 11 is driven via two clock lines, via which the read-in and read-out clock into the register can be defined independently. By means of the FIFO register 11, the transmission clock of the data transmitter 11, which is predetermined by a transmission clock unit 12 in FIG. 1, can thus be decoupled from the clock of the components of the integrated circuit that are connected upstream.

The data read into the FIFO register 11 in parallel with the clock of the components connected upstream are applied in parallel with the transmission clock predetermined by the transmission clock unit 12, to the eight inputs of the parallel-serial converter 13, which converts the data applied in parallel into a serial data stream and forwards the latter to a coder 14 which formats the serial data stream and applies the formatted data signals, with the transmission clock predetermined by the transmission clock unit 12 to an output driver 15, which then outputs the data signals in amplified fashion on to the data transmission channel 2. In this case, the data signals can be transmitted electrically, as light signals or as radio signals, to be precise in line-conducted fashion or wirelessly. In the case of semiconductor memories, the data signals are generally transmitted on a data transmission channel—comprising two impedance controlled interconnects operated differentially—between the data transmitter 1 and the data receiver 3.

As shown in FIG. 1, the data receiver 3 has an input driver 31, which amplifies the arriving data signals and forwards them to a sampling unit 32, which samples the data signals in accordance with a reception clock predetermined by a reception clock unit 33 and evaluates them and applies them as a bit-serial data stream to a serial-parallel converter 34 which parallelizes the bit-serial data stream and forwards it to the eight inputs of a FIFO register 35. The FIFO register 35 reads in the applied data in parallel with the reception clock and then outputs them again in parallel with the clock provided by the components connected downstream.

The serial data transmission is generally effected clock-synchronously, in which case the reception clock unit 33 of the data receiver 1 derives the clock signal directly from the arriving data signals, in order to save an additional clock line between data transmitter 1 and data receiver 3. The clock and data recovery in the data receiver 3 is usually carried out with the aid of an oversampling of the received data signal sequence with phase selection. For this purpose, the data signal sequence is sampled multiply within the period length of the data signal sequence by means of clocked samplers of the sampling unit 32 that are arranged in parallel. The resulting data stream of the samplers of the sampling unit 32 is searched for signal changes with the aid of a downstream circuit, in order to obtain phase information therefrom. On the basis of the phase information, a decision unit of the sampling unit 32 then defines the sampling signal as received data signal that was sampled in the center of the data eye.

Figure 2:
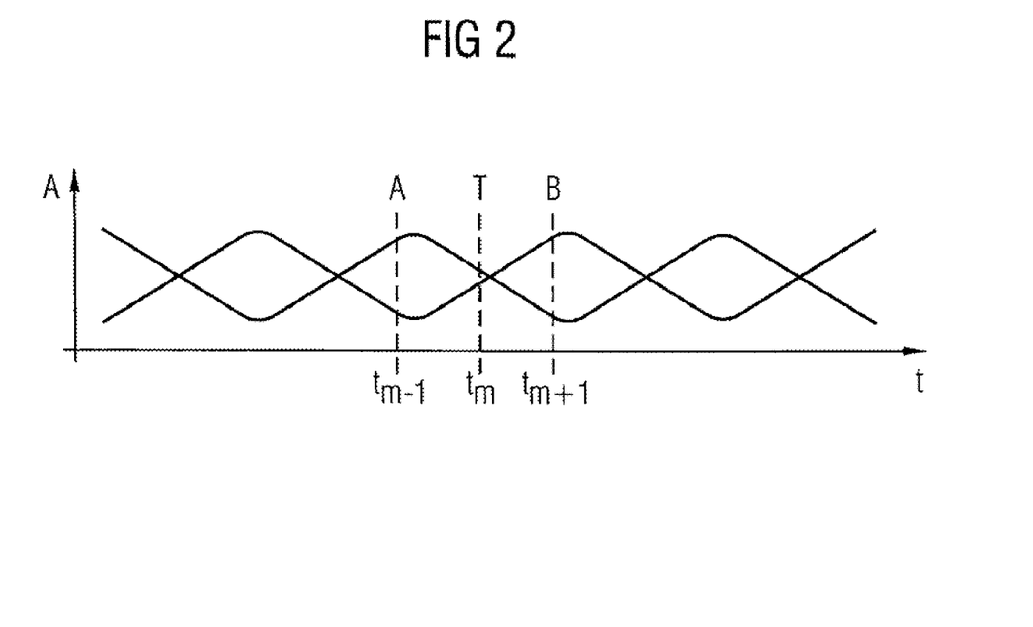
FIG. 2 shows the representation of a data signal sequence profile received by a data receiver in the form of an idealized eye diagram with three sampling operations for an oversampling for data and clock recovery.

The procedure will be explained briefly below with reference to FIG. 2. FIG. 2 shows an eye diagram of a data signal sequence such as that present at the sampling unit 32 of the data receiver 3. The eye diagram is a representation of the data signal sequence at the input of the sampling unit 32 that is obtained by means of many data signal elements that occur temporally successively being written over one another in oscillographic fashion. In this case, FIG. 2 shows a data signal sequence with a so-called NRZ formatting (no return to zero). In the case of NRZ formatting, each data bit is represented by a rectangular pulse. The presence of the pulse identifies the high state and the absence of said pulse identifies the low state. In this case, FIG. 2 shows the eye diagram for an ideal transmission path with a maximum eye opening as far as both the height and the length of the data signal are concerned.

Figure 3:
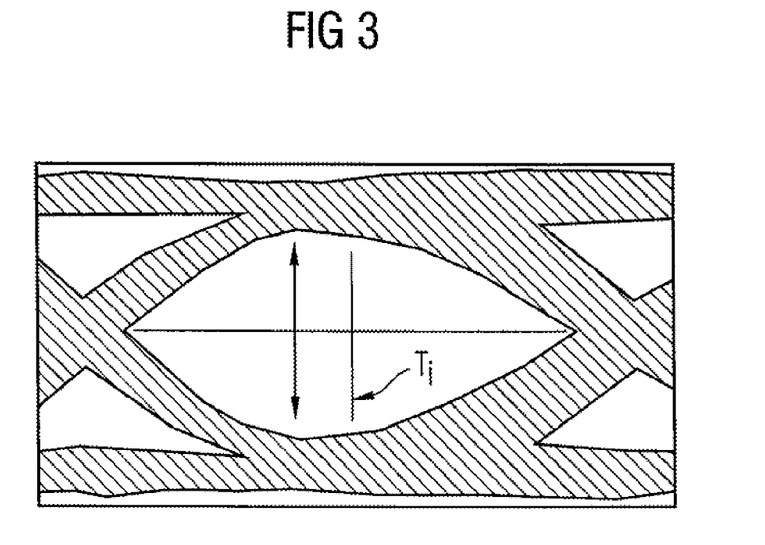
FIG. 3 shows a deformed data eye with the ideal sampling instant for data recovery determined with the aid of the oversampling method.

On account of distortions during transmission as a result of clock jitter, bandwidth limitation on the data transmission channels, etc. the data eye is generally greatly deformed, however. FIG. 3 shows such a deformed eye opening, in which the data eye is decreased by amplitude fluctuation in the vertical direction and is narrowed in the horizontal direction by zero crossings of the signal voltage that commence at different instants. Thus, e.g. for communication between chips on a printed circuit board on which the data transmission channel is operated at 3.125 Gbit/s, only 35% of the respective eye opening can be utilized, resulting in a length of the eye opening of 112 psec. The rest of the eye cell is disturbed by clock jitter, interpole interferences, reflections, etc.

For clock recovery in the case of the idealized eye diagram shown in FIG. 2, oversampling is effected with two samplings per pulse duration of the data signal. The individual sampling signals are therefore phase-shifted by 180° relative to one another. In this case, three sampling instants $T_{M-1}$, $T_M$ and $TM_{M+1}$ at which the samples A, T and B are determined are identified in FIG. 2. In this case, the samples A and T at the instant $T_{M-1}$ and T lie in the same data eye for which reason no signal change occurs between the two samples. By contrast the samples T and B at the instant TM and $T_{M+1}$ lie in different data eyes, with the result that a signal change is present between the two samples. An assessment circuit in the sampling unit 33 then recognizes from this sampling data sequence, on account of the signal change occurring between the sampling signal T and B, that the data signals are being sampled too early, and then subsequently delays the sampling by a predetermined time step in order to have the effect that the sampling A and B, the samples of which are defined as the received data signals by the decision unit of the sampling unit, is effected in the temporal center of the data eye. The ideal sampling instant $T_i$ for data recovery determined with the aid of the oversampling method is depicted for the deformed data eye in FIG. 3.

The clock and data recovery by means of an oversampling of the received data signal sequence and subsequent phase selection entails a high outlay on circuitry and a high energy consumption. For the oversampling, as shown in FIG. 2, it is necessary for at least two samplers to be provided in order to be able to carry out at least two sampling operations per arriving data signal. On account of the data eye deformed during the data transmission and thus the reduced eye width, however, generally a significantly higher sampling rate is necessary for reliable data and clock recovery. What is more, the oversampling leads to a high data stream that can only be processed with a high outlay in respect of circuitry and energy.

Furthermore, in the method for clock and data recovery by oversampling of the received signal sequence with phase selection, the sampling is oriented such that the sampling in the center of the eye relative to the length of the eye opening is selected as arriving data signal by the decision unit of the sampling unit. As shown, however, by the double-headed arrow at the location of the maximum eye width and the sampling instant $T_i$ determined with the aid of the oversampling in the center of the eye in the data eye illustrated in FIG. 3, the center of the eye is not necessarily the optimum sampling instant, that is to say the instant at which the maximum signal amplitude is present. This is because the maximum eye width, that is to say the instant of the largest signal amplitude, and the center of the eye do not coincide in the case of the eye illustrated in FIG. 3. This has the effect that the data and clock recovery with oversampling and phase selection does not always involve sampling and evaluation of the largest signal amplitude, which can lead to the occurrence of bit errors.

A data receiver, in particular for use in a serial data transmission system, and a data memory having a simplified switching arrangement for clock and data recovery should have a low energy consumption and a low data processing outlay.

The data receiver has a sampling unit connected to a data signal input and serving for sampling a data signal amplitude and amplifying the sampled data signal amplitude to a predetermined value, a sampling clock generator unit connected to the sampling unit and serving for predetermining a sampling clock for the sampling unit, an evaluation unit connected to the sampling unit and serving for determining the time duration required by the sampling unit for amplifying the sampled data signal amplitude to the predetermined value and evaluating the time duration determined, and a control unit connected to the evaluation unit and the sampling clock generator unit and serving for defining the sampling clock on the basis of the time duration determined by the evaluation unit.

Consequently, only one individual sampling unit is required for clock and data recovery in the data receiver. From the individual sampling signal sampled by said sampling unit per received data signal period, the ideal sampling instant within the data eye, that is to say when the signal amplitude is largest, is determined by determining the time duration required to amplify the sampled data signal amplitude to the decision threshold value at which the evaluation unit defines the digital data information, that is to say decides whether the data signal is in the high state or in the low state. The time duration required for the amplification identifies the temporal position of the sampling relative to the maximum width of the data eye, that is to say the ideal sampling instant. Specifically, the closer the sampling instant comes to the maximum data eye width, the shorter the time duration necessary for amplifying the sampled data signal amplitude to the threshold value required for the evaluation. Consequently, the amplification time duration represents a measure of the deviation of the actual sampling instant from the ideal sampling instant at the maximum eye width and thus forms the basis for a readjustment of the sampling instant in the data receiver to the ideal sampling instant at the maximum eye width.

The procedure is distinguished by a simple circuit construction and a low energy consumption. Furthermore, a low area requirement arises for the circuit, which is advantageous particularly for use in data memories. In addition, the procedure always shifts the sampling to the ideal sampling instant, namely to the instant of maximum eye height, which, after all, need not necessarily coincide with the temporal center of the data eye opening.

In accordance with an embodiment, the control unit and the evaluation unit are designed to minimize the time duration required by the sampling unit for amplifying the sampled data signal amplitude to the predetermined value, preferably by altering the clock length of the sampling clock of the sampling clock generator step by step. The sampling clock shift to the instant of maximum data eye width is carried out in a simple manner with this procedure.

In accordance with a further embodiment, the evaluation unit has a reference amplifier unit connected to the sampling generator and serving for amplifying a reference signal amplitude to the predetermined value, and a comparator unit for comparing the time duration required by the reference amplifier unit for amplifying the reference signal amplitude to the predetermined value with the time duration required by the sampling unit for amplifying the sampled signal amplitude to the predetermined value. With this circuit design, the deviation of the present sampling instant from the ideal sampling instant can be ascertained in a simple manner, i.e. with a low circuitry outlay and a low energy consumption. The ideal sampling instant is defined by the time duration necessary for the amplification of the reference signal amplitude. By comparing the time duration required for amplifying the sampled data signal with this reference time duration, it is then possible to perform any necessary readjustment of the sampling instant.

The data receiver can furthermore be used in a serial transmission system, in particular in a transmission system inserted into a memory.

In order to produce synchronism between data transmitter and data receiver in a serial data transmission system and in order at the same time to be able to dispense with an additional clock line between data transmitter and data receiver, besides the transmitted data information the clock information is also recovered from the transmitted bit-serial data stream of a reception signal in the data receiver with the aid of a data and clock recovery circuit. This operation of recovering clock and data in the data receiver is also referred to as clock and data recovery (CDR).

In the case of a serial data transmission system, in particular also for communication between chips on a printed circuit board, as shown in FIG. 1, the data are transmitted at transmission rates in the gigabytes range per second and data transmission channel. As a result of clock jitter, bandwidth limitation of the data transmission channel, interpole interferences and also reflections and crosstalk between adjacent channels, however, the signal profile is greatly deformed during transmission, such that the useable opening of the data eye per bit cell is limited to a few hundred picoseconds. If the data and clock recovery is effected with the aid of a oversampling with phase selection, as shown schematically in FIG. 2, a multiplicity of parallel sampling units are therefore required in order to ensure that a multiple sampling is carried out within a data eye as well. The high digital data stream that arises during said oversampling is subsequently searched for signal changes with the aid of a downstream complex circuit in order to obtain phase information, on the basis of which the sample determined in the center of the data eye is then selected as received data bit. As a result of the selection—effected during the oversampling with phase selection—of the data value always in the center of the data eye, there is the risk of a bit error occurring in the case of a deformed data eye, as shown in FIG. 3, since the sample having the largest signal amplitude is not automatically selected as data value.

A data and clock recovery circuit for a data receiver is proposed by means of which the received data value can be determined on the basis of the maximum signal amplitude in the transmitted data eye in a simple manner with little outlay on hardware and with a low energy consumption. The circuit construction in the data receiver and the procedure are explained below with reference to FIGS. 4 to 7. The data receiver can be used in particular in a serial data transmission system such as is shown in FIG. 1 and used in data memories, inter alia.

Figure 7:
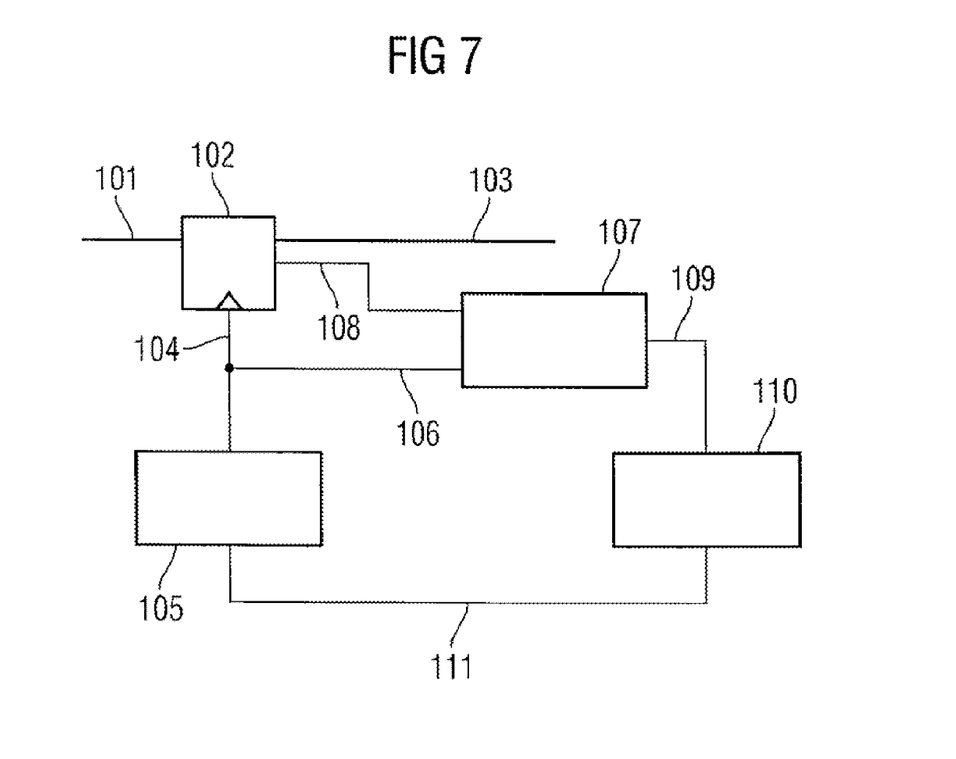
FIG. 7 shows a block diagram of a data and clock recovery circuit.

As illustrated in FIG. 7, a data signal input 101 of the data receiver is connected to a sampling unit 102 for sampling a received signal amplitude and amplifying the sampled signal amplitude to a decision threshold value. Upon the decision threshold value being reached, the sampling unit 102 decides whether the sampled data signal is in the highstate or in the low state. The sampling unit 102 then outputs the data information in the form of a bit-serial data stream at data signal output 103 for further processing, e.g. as shown in FIG. 1 to a serial-digital converter.

As is furthermore shown in FIG. 7, a control line 104 of the sampling unit 102 is connected to a sampling clock generator 105, by means of which the sampling clock generator 105 predetermines a sampling clock for the sampling unit 102. The sampling clock generator 105 simultaneously also applies the sampling clock to a first data input 106 of an evaluation unit 107. The evaluation unit 107 is furthermore connected via a second data input 108 to the sampling unit 102, which indicates on this data line the instant at which the sampling unit 102 has amplified the sampled data signal amplitude to the decision threshold value. The evaluation unit 107 then determines, from the sampling clock applied by the sampling clock generator 105 and the end instant of the amplification of the sampled data signal amplitude as determined by the sampling unit 102, the time duration which was required for amplifying the sampled data signal amplitude to the decision threshold value, and evaluates said time duration in order to ascertain whether the sampling is effected at the optimum sampling instant, namely when the sampled data amplitude is a maximum.

On the basis of the evaluation result, the evaluation unit 107 applies an evaluation signal via a control line 109 to a control unit 110, which is in turn connected to the sampling clock generator 105 via a control line 111 in order to define, on the basis of the evaluation signal applied by the evaluation unit 109, the sampling clock of the sampling clock generator 105 at the optimum sampling instant, that is to say when the signal amplitude in the data eye is a maximum. The definition of the sampling clock output by the sampling clock generator 105 by means of the evaluation unit 107 and the control unit 110 connected downstream is effected, in accordance with one preferred embodiment, in such a way that the time duration required for amplifying the sampled signal amplitude to the decision threshold value is the minimum.

Figure 4:
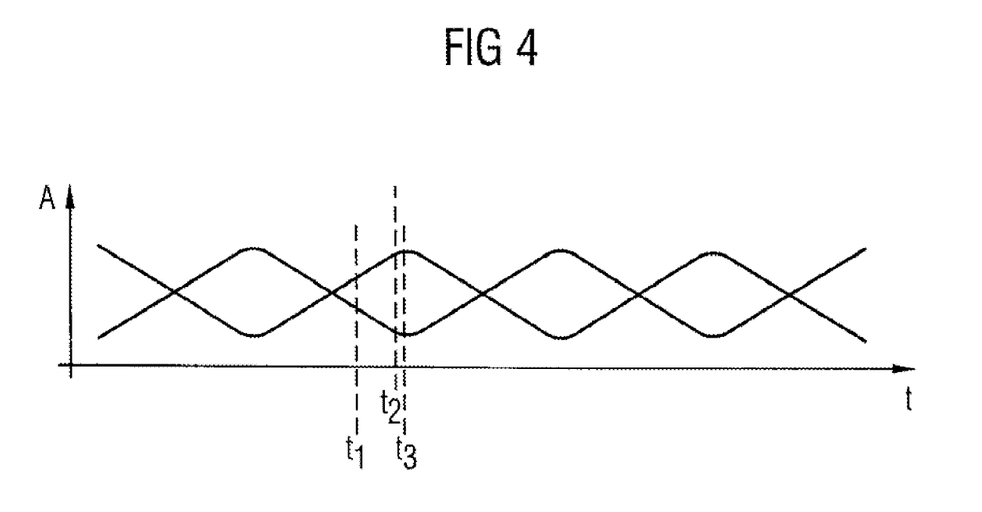
FIG. 4 shows the signal profile at a data receiver in the form of an idealized data eye diagram with three sampling instants of the data receiver.
Figure 5:
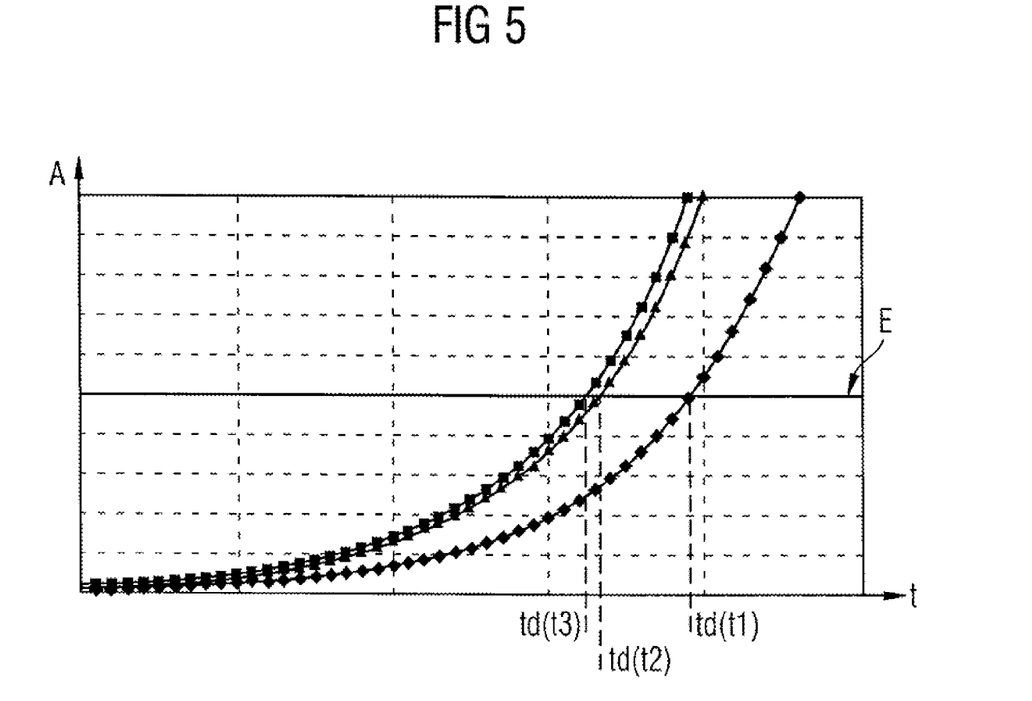
FIG. 5 shows a diagram of the temporal profile of the signal amplification by the data receiver for the sampling instants shown in FIG. 3.

FIGS. 4 and 5 show the relationship between the sampling instant and the time duration required to amplify the data signal sampled at a specific sampling instant to the decision threshold value, the overshooting of which is then used to define whether the sampled data signal is in the high state or in the low state. FIG. 4 illustrates an ideal eye diagram analogously to the one shown in FIG. 2, such as is present at the data input 101 of the sampling unit 102. $T_1$, $T_2$ and $T_3$ show various possible sampling instants in the eye diagram, the sampling $T_1$ being effected at the start of the data eye with low signal amplitude, the sampling $T_2$ being effected shortly before the maximum signal amplitude is reached, and the sampling $T_3$ being effected at the instant of the maximum signal amplitude of the data eye. FIG. 5 then illustrates the possible temporal profile of the amplification of the sampled signal amplitude for the various sampling instants $T_1$, $T_2$, $T_3$. The decision threshold value E at which the sampling unit 102 takes the decision about the data value of the sampled data signal, is simultaneously entered in FIG. 5. FIG. 5 clearly shows that the time duration required for the amplification of the sampled data signal is shorter, the closer the sampling instant is to the data eye, that is to say the higher the signal value sampled at the beginning.

Figure 6:
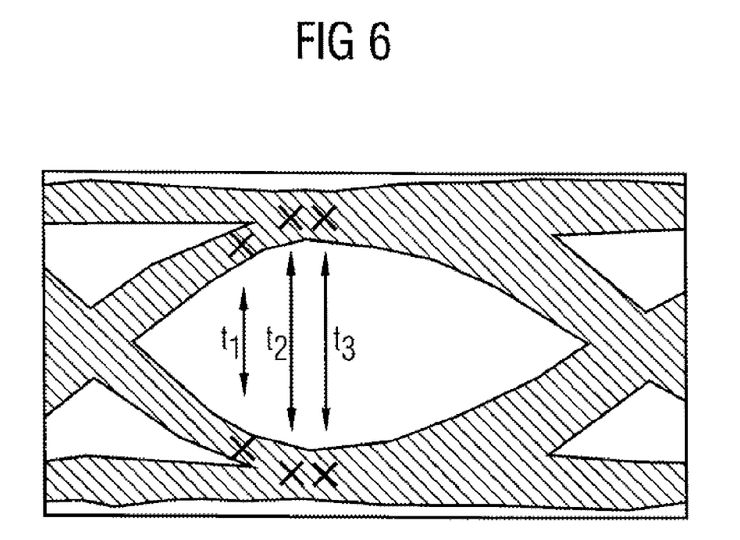
FIG. 6 shows a deformed data eye with the sampling instants shown in FIG. 4.

With the design of the evaluation unit 107 and the control unit 110 of the data and clock recovery circuit for minimizing the time duration required by the sampling unit 102 for amplifying the sampled data signal amplitude to the predetermined value by correspondingly adapting the sampling clock of the sampling clock generator 105, the sampling of the data signal at the instant of the maximum data eye width is ensured in a simple manner. FIG. 6 illustrates a distorted data eye analogously to the data eye shown in FIG. 3, the various sampling instants $T_1$, $T_2$ and $T_3$ being entered. As illustrated in FIG. 6, the procedure ensures that even in the case of a data eye deformed on account of signal disturbances occurring during transmission, as a result of the sampling instant being shifted to the instant of the minimum amplification time duration $T_3$, the data eye is sampled at the instant of the maximum eye width and hence at the instant of the maximum signal amplitude. This reliably prevents bit errors from occurring during the sampling. At the same time, with the procedure only one sampling unit is required and a low outlay on circuitry and a low energy consumption are thus achieved.

Figure 8:
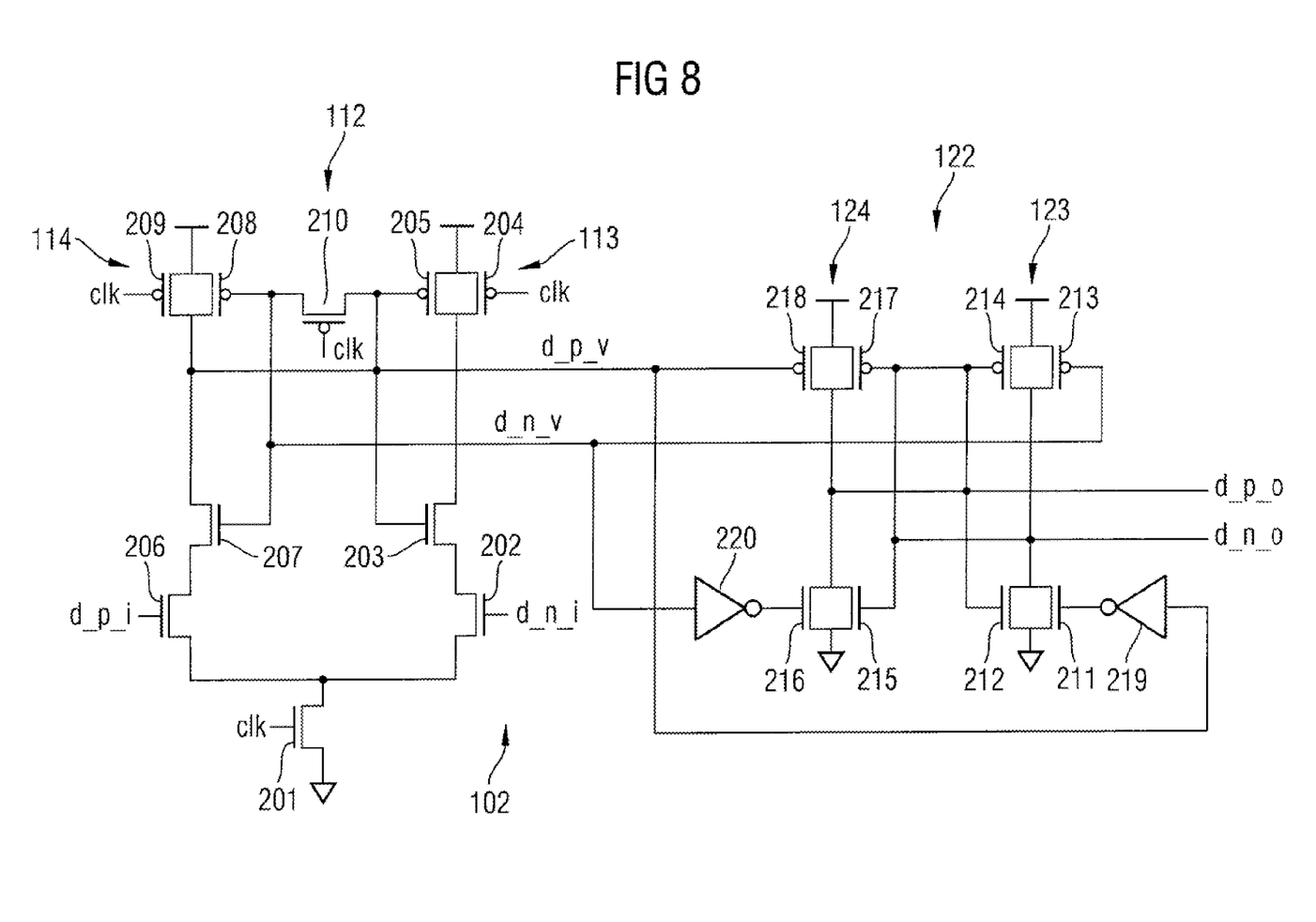
FIG. 8 shows a block diagram of a sampling unit in a data and clock recovery circuit.

FIG. 8 shows a possible embodiment of a sampling unit 102. In this case, the sampling unit is composed of a differential amplifier 112 and a bistable multivibrator 122 connected downstream, known as an SR latch. The sampling unit 102 illustrated is suitable in particular for use in a data receiver on a data memory in which the data signals are transmitted on a transmission channel comprising two impedance-controlled interconnects operated differentially.

The differential amplifier 112 of the sampling unit 102 is constructed symmetrically and is composed of two switching branches 113, 114 arranged in parallel which are in each case connected to ground and a supply voltage (not shown). In this case, the connection to the supply voltage is effected via an n-channel transistor 201 switched with the sampling clock signal clk of the sampling clock generator 105. Each of the two switching branches 113, 114 has, proceeding from the n-channel transistor 201 establishing the connection to the supply voltage, two series-connected n-channel transistors 202, 203, 206, 207 connected to ground via two parallel-connected p-channel transistors 204, 205, 208, 209.

One of the two parallel-connected p-channel transistors 204, 209 in each case is driven with the sampling clock signal clk. The gate electrodes of the respective other of the two p-channel transistors 205, 208 of the two switching branches 113, 114 are connected to one another via a further p-channel transistor 210, to which the sampling clock signal clk is applied. The n-channel transistors 202, 206 of the two switching branches 113, 114 which are connected to the n-channel transistor 201 establishing the connection to the supply voltage have one of the two data signals d_p_i, d_n_i applied to them in each case via the gate electrodes, said data signals being received on the two impedance-controlled interconnects operated differentially. Between the n-channel transistors and the p-channel transistors of the two switching branches 113, 114 of the differential amplifier 112, the amplified signals can then be tapped off on the output lines d_p_v, d_n_v. The gate electrodes of the two n-channel transistors 203, 207 connected downstream of the n-channel transistors 202, 206 are furthermore connected to the gate electrodes of the two p-channel transistors 205, 208, which are interconnected via the p-channel transistor 210, and the two output lines d_p_v, d_n_v.

The SR latch 122 disposed downstream of the differential amplifier 112 can switch back and forth between two fixed voltage values that can be tapped off via the output lines d_p_o, d_n_o. The RS latch 122 has two symmetrical switching branches 123, 124 comprising, in each case connected in series, a parallel circuit of two n-channel transistors 211, 212, 215, 216 and two p-channel transistors 213, 214, 217, 218, the switching branches in each case being connected between the supply voltage (not shown) and ground. The gate electrodes of in each case one n-channel transistor 212, 215 and one p-channel transistor 214, 217 in each switching branch are connected to one another and to the output lines d_p_o, d_n_o.

A respective inverter 219, 220 is connected upstream of the two other n-channel transistors 211, 216 in the switching branches 123, 124 of the RS latch 122, said inverter being connected to one of the two output lines d_p_v, d_n_v of the differential amplifier 112. The two output lines d_p_v, d_n_v of the differential amplifier 112 are in each case also connected to the gate electrode of the p-channel transistor 213, 218 in the other switching branch of the SR latch.

The sampling unit 102 illustrated in FIG. 8 operates such that, if the sampling clock signal clk present at the differential amplifier 112 changes to the high state, the supply voltage is applied to the differential amplifier 112 via the n-channel transistor 201, whereby the data signals d_p_i, d_n_i present via the two impedance-controlled interconnects operated differentially are amplified differentially. The amplified data signals are then present at the SR latch 122 via the two output lines d_p_v, d_n_v. The SR latch 122 switches, if the amplified data signals reach the corresponding differential voltage, into one of the two stable states that can be tapped off in the form of the fixed voltage values via the two output lines d_p_o, d_n_o of the SR latch 122. When the sampling clock signal clk changes from the high state to the low state, the n-channel transistor 201 of the differential amplifier 112 then interrupts the connection to the supply voltage. At the same time, the p-channel transistors 204, 205, 208, 209 of the differential amplifier 112 are turned on in order to reset the differential amplifier.

In the case of the sampling unit 102 illustrated in FIG. 8, the threshold value at which the sampling unit takes the decision about the data value of the sampled data signal is defined by the set voltage of the SR latch 122 of the sampling unit. This switching operation of the SR latch 122 of the sampling unit 102 is registered by the evaluation unit 107, which is disposed downstream of the sampling unit, via the data line 108. At the same time, the sampling clock signal clk is also applied to the evaluation unit 107 by the sampling clock generator unit 105. The evaluation unit 107 then ascertains the temporal delay between the change of the sampling clock signal clk from the low state to the high state and the resultant triggered switching operation of the SR latch 122 in the sampling unit 102, which reproduces the time duration required by the sampling unit 102 for amplifying the sampled data signal amplitude and evaluates this delay time. In this case, the evaluation unit 107 determines, in particular, whether the delay time is a minimum. On the basis of the evaluation result, the evaluation unit 107 then applies a corresponding control signal via the data line 109 to the control unit 110 which thereupon in turn sets the sampling clock of the sampling clock generator to the optimum sampling instant via the data line 111.

Figure 9:
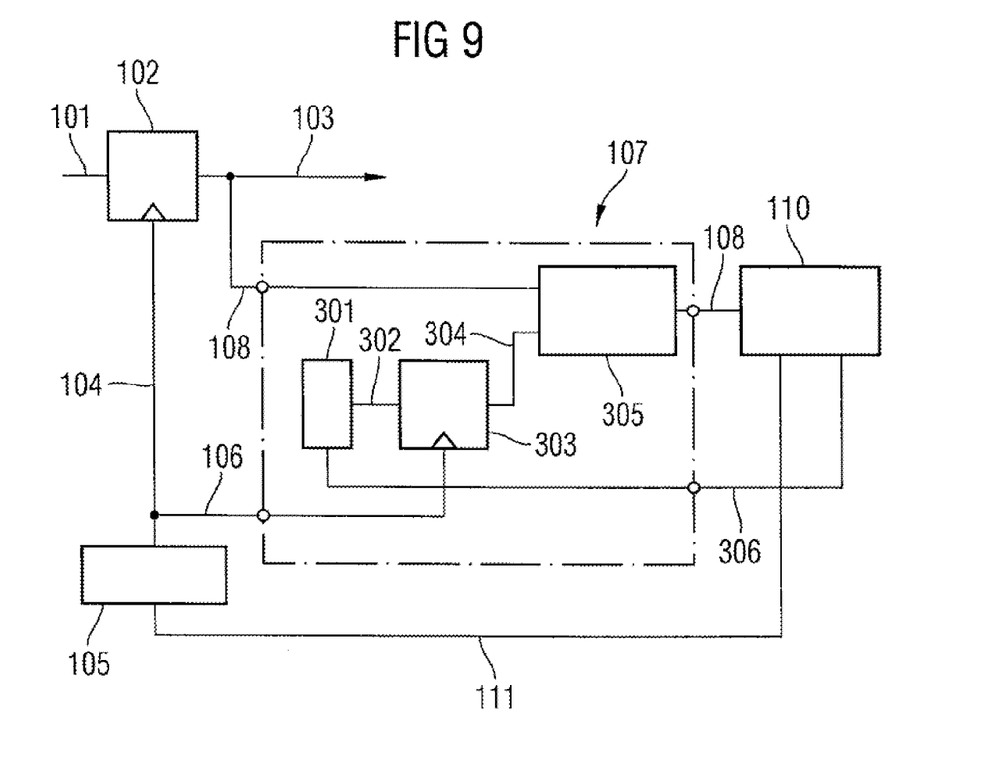
FIG. 9 shows a block diagram of a first embodiment of an evaluation unit in a data and clock recovery circuit.

FIG. 9 shows a block diagram of a first embodiment of an evaluation unit 107 for use in a data and clock recovery circuit according to the invention. In this case, the evaluation unit 107 has a reference signal transmitter 301 connected to a reference sampling unit 303 via a reference signal line 302. The reference sampling unit 303 samples a reference signal applied by the reference signal transmitter 301 via the reference signal line 302 and amplifies the sampled reference signal amplitude to the decision threshold value corresponding to the decision threshold value of the sampling unit 102. In this case, the reference sampling unit 303 may be constructed analogously to the sampling unit illustrated in FIG. 8.

Upon the decision threshold value being reached, the reference sampling unit 303 applies a corresponding data signal via a data line 304 to one input of a comparator unit 305. The data signal of the sampling unit 102 is applied to the other input of the comparator unit 305 via the data line 108. The comparator unit 305 compares the temporal arrival of the two data signals and outputs the evaluation result as data signal via the data line 109 to the control unit 110. The control unit 110 in turn generates, on the basis of the data signal of the comparator unit 305 of the evaluation unit 107, the control signal for the sampling clock generator and, in addition a control signal for the reference signal transmitter 301 of the evaluation unit, which is applied via an additional data line 306. The sampling clock generator 105 applies the sampling clock signal generated on the basis of the control signal of the control unit both to the sampling unit 102 and to the reference sampling unit 303.

For the setting of the sampling unit 102 to a sampling at the instant of maximum data eye width of the received data signal, the procedure is as follows: in a training phase, the sampling clock predetermined by the sampling clock generator 105 for the sampling unit 102 and the reference sampling unit 303 is adjusted by feedback via the comparator unit 305 and the control unit 110 in a manner, preferably step by step, until the reference signal amplitude generated by the reference signal transmitter 301 is a maximum. For this purpose, in a first step, the control unit 110 readjusts the reference signal amplitude output by the reference signal transmitter 310 until the comparator unit 305 ascertains that both the sampling unit 102 and the reference sampling unit 303 have at the same instant reached the decision threshold value in the amplification of sampled signal amplitude and the sampled reference signal amplitude, respectively.

If, after this first training step the control unit 110 has driven the reference signal transmitter 301 in such a way that the reference sampling unit 303 has reached the decision threshold value at the same time as the sampling unit 102, in a second step the control unit 102, with the aid of the control signal to the sampling clock generator 105, increases the clock length of the sampling clock, preferably step by step by one time unit. After increasing the sampling clock length, the control unit 110 then again readjusts the reference signal amplitude generated by the reference signal transmitter 301 until the sampling unit 102 and the reference sampling unit 303 have once again at the same instant reached the decision threshold value in the amplification of sampled signal amplitude and the sampled reference signal amplitude respectively. The control unit 110 then compares the reference signal amplitude set prior to the clock adjustment at the reference signal transmitter 301 with the newly set reference signal amplitude.

If the comparison reveals that the reference signal amplitude has increased, the sampling clock is once again increased by a time step by the control unit 110. By contrast, if the reference signal amplitude has decreased, the sampling clock increase is cancelled again by the control unit 110 and the sampling clock is decreased by a further time unit. For this new sampling clock, the signal amplitude output by the reference signal transmitter 301 is then once again readjusted by the control unit 110 until the decision instant of the sampling unit 102 and that of the reference sampling unit 303 coincide. The control unit 110 then determines whether the newly resulting reference signal amplitude is lower or higher than the initial reference signal amplitude.

During the training method, step 2 is repeated iteratively until the reference signal amplitude output by the reference signal transmitter 303 is a maximum. This is then the instant at which the time duration required by the sampling unit for amplifying the sampled data signal to the decision threshold value is a minimum, and hence the instant at which the largest signal amplitude is present in the received data eye.

The setting of the optimum sampling instant is preferably performed before the start of the data transmission with a training data signal sequence and can then be repeated periodically. In order to ascertain the need for a new training phase, the procedure may also be such that the sampling clock is reset by the control unit to the initial sampling clock period length before the training method is carried out, and then the time duration required by the sampling unit 102 for amplifying the sampled signal amplitude and the time duration required by the reference sampling unit 303 for amplifying the reference signal amplitude to the decision threshold value are compared. If the comparator unit 305 then ascertains that the time duration for amplifying the reference signal amplitude is shorter than the time duration for amplifying the sampled signal amplitude, the control unit 110 initiates a new training phase.

Figure 10:
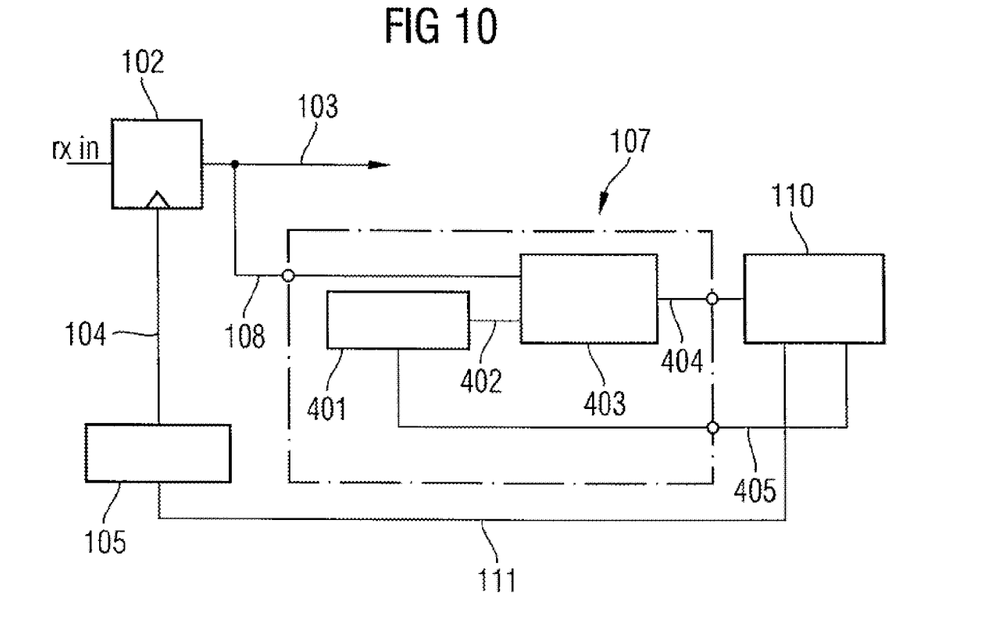
FIG. 10 shows a block diagram of a second embodiment of an evaluation unit in a data and clock recovery circuit.

FIG. 10 shows a second embodiment of an evaluation unit 107 in a data and clock recovery circuit according to the invention. In this design, the evaluation unit 107 has a reference timer unit 401 which outputs a reference time signal via a data line 402 to one input of a comparator unit 402. The data signal of the sampling unit 102 is present at a second input of the comparator unit 402, said data signal being output by the sampling unit after reaching the decision threshold value during the amplification of the sampled signal amplitude. The comparator unit 305 compares the temporal arrival of the two data signals and outputs the evaluation result as data signal to the control unit 110 via the data line 404.

The control unit 110 again generates, on the basis of the data signal of the comparator unit 403 of the evaluation unit 107, the control signal for the sampling clock generator and in addition a control signal for the reference timer 301 of the evaluation unit, which is applied via an additional data line 405. The sampling clock generator 105 applies the sampling clock signal generated on the basis of the control signal of the control unit 105 to the sampling unit 102.

In the case of the design of the evaluation unit 107 as shown in FIG. 10, the setting of the optimum sampling clock period is in this case effected by virtue of the fact that in a training phase, in a first step, the reference timer 401 is preferably readjusted step by step in such a way that the reference time signal output by the reference timer unit 401 is present simultaneously with the data signal output by the sampling unit at the comparator unit 403. In a second step, the control unit 110 then increases the sampling clock preferably by one time step and then correspondingly readjusts the reference timer unit 401 until the reference time signal output by the reference timer unit 401 is again present simultaneously with the data signal output by the sampling unit 102 at the comparator unit 403.

If the control unit 110 then ascertains that the period length of the reference time signal is then shortened relative to the initial period length, the sampling clock is increased by a further time step by the control unit 110. Otherwise, the sampling clock is reset by the control unit 110 and decreased by a further time step in order once again to readjust the period length of the reference time signal output by the reference timer 401. The operation is repeated until the minimum period length of the reference time signal, corresponding to the minimum amplification time duration of the sampling unit 102 is determined.

Although the circuitry construction of the evaluation unit 107 in accordance with the second embodiment is simpler and therefore more cost-effective than the circuitry construction of the evaluation unit 107 in accordance with the first embodiment, the first embodiment makes it possible, by contrast, through the use of a reference amplification, to take account of temperature and operational effects in the data receiver in the setting of the optimum sampling instant.

Only one individual sampling unit is required for clock and data recovery in the data receiver. From the individual sampling signal sampled by said sampling unit per received data signal period, the ideal sampling instant within the data eye, that is to say when the signal amplitude is largest, is determined by determining the time duration required to amplify the sampled data signal amplitude to the decision threshold value at which the evaluation unit defines the digital data information, that is to say decides whether the data signal is in the high state or in the low state. The time duration required for the amplification identifies the temporal position of the sampling relative to the maximum width of the data eye, that is to say the ideal sampling instant. Specifically, the closer the sampling instant comes to the maximum data eye width, the shorter the time duration necessary for amplifying the sampled data signal amplitude to the threshold value required for the evaluation. Consequently, the amplification time duration represents a measure of the deviation of the actual sampling instant from the ideal sampling instant at the maximum eye width and thus forms the basis for a readjustment of the sampling instant in the data receiver to the ideal sampling instant at the maximum eye width.

The procedure is distinguished by a simple circuit construction and a low energy consumption. Furthermore, a low area requirement arises for the circuit, which is advantageous particularly for use in data memories. In addition, the procedure always shifts the sampling to the ideal sampling instant, namely to the instant of maximum eye height, which, after all, need not necessarily coincide with the temporal center of the data eye opening.

The preceding description describes advantageous exemplary embodiments. The features disclosed therein and the claims and the drawings can, therefore, be useful for realizing various embodiments, both individually and in any combination. While the foregoing is directed to specific embodiments, other and further embodiments may be devised without departing from the basic scope, the scope being determined by the claims that follow.

What is claimed is:

1. A data receiver, comprising:
   a sampling unit connected to a data signal input and configured to sample a data signal amplitude and amplify the sampled data signal amplitude to a predetermined value;
   a sampling clock generator unit connected to the sampling unit and configured to predetermine a sampling clock for the sampling unit;
   an evaluation unit connected to the sampling unit and configured to determine a time duration required by the sampling unit for amplifying the sampled data signal amplitude to the predetermined value, and further configured to evaluate the time duration; and
   a control unit connected to the evaluation unit and the sampling clock generator unit and configured to define the sampling clock on the basis of the evaluation of the time duration determined by the evaluation unit.

2. The data receiver as claimed in claim 1, wherein the control unit and the evaluation unit minimize the time duration required by the sampling unit for amplifying the sampled data signal amplitude to the predetermined value.

3. The data receiver as claimed in claim 2, wherein the control unit alters the clock length of the sampling clock of the sampling clock generator unit stepwise on the basis of the evaluation of the time duration determined by the evaluation unit, in order to minimize the time duration required by the sampling unit for amplifying the sampled data signal amplitude to the predetermined value.

4. The data receiver as claimed in claim 1, wherein the evaluation unit has a reference amplifier unit connected to the sampling clock generator unit and configured to amplify a reference signal amplitude to the predetermined value, and a comparator unit for comparing the time duration required by the reference amplifier unit for amplifying the reference signal amplitude to the predetermined value with the time duration required by the sampling unit for amplifying the sampled data signal amplitude to the predetermined value.

5. The data receiver as claimed in claim 4, wherein the reference amplifier unit of the evaluation unit has a reference signal transmitter connected via a reference signal line to a reference sampling unit which samples a reference signal applied by the reference signal transmitter and amplifies the reference signal to the amplification value of the sampling unit and, upon the amplification value being reached, outputs a corresponding data signal via a data line to one input of the comparator unit, to the second input of which the data signal of the sampling unit is applied via a data line, wherein the comparator unit compares and evaluates the temporal arrival of the two data signals and outputs the evaluation result to the control unit via a data line.

6. The data receiver as claimed in claim 1, wherein the evaluation unit has a reference timer unit, which outputs a reference time signal via a data line to one input of a comparator unit, to the second input of which the data signal of the sampling unit is applied via a data line, wherein the comparator unit compares and evaluates the temporal arrival of the two data signals and outputs the evaluation result to the control unit via a data line.

7. The data receiver as claimed in claim 1, wherein the sampling unit has a differential amplifier and a bistable multivibrator connected downstream, wherein the differential amplifier, upon application of the sampling clock by the sampling clock generator unit differentially amplifies two data signals present at the data signal input and applies the amplified data signals to the bistable multivibrator, which switches into a stable state upon a corresponding differential voltage being reached, said stable state being applied to the evaluation circuit via a data line.

8. The data receiver as claimed in claim 7, wherein the sampling clock unit applies the sampling clock to the evaluation unit simultaneously with the application to the differential amplifier, said evaluation unit then determining and evaluating the temporal delay between the application of the sampling clock and the switching operation of the multivibrator that is triggered thereby.

9. A serial data transmission system comprising a data transmitter for serially transmitting data signals, a data transmission path and a data receiver, the data receiver, comprising:
   a sampling unit connected to a data signal input and configured to sample a data signal amplitude and amplify the sampled data signal amplitude to a predetermined value;
   a sampling clock generator unit connected to the sampling unit and configured to predetermine a sampling clock for the sampling unit;
   an evaluation unit connected to the sampling unit and configured to determine a time duration required by the sampling unit for amplifying the sampled data signal amplitude to the predetermined value and evaluate the time duration; and a control unit connected to the evaluation unit and the sampling clock generator unit and configured to define the sampling clock on the basis of the evaluation of the time duration determined by the evaluation unit.

10. The serial data transmission system as claimed in claim 9, wherein the control unit and the evaluation unit minimize the time duration required by the sampling unit for amplifying the sampled data signal amplitude to the predetermined value.

11. The serial data transmission system as claimed in claim 10, wherein the control unit alters the clock length of the sampling clock of the sampling clock generator unit stepwise on the basis of the evaluation of the time duration determined by the evaluation unit, in order to minimize the time duration required by the sampling unit for amplifying the sampled data signal amplitude to the predetermined value.

12. The serial data transmission system as claimed in claim 9, wherein the evaluation unit comprises:
   a reference amplifier unit connected to the sampling clock generator unit and configured to amplify a reference signal amplitude to the predetermined value; and
   a comparator unit configured to compare the time duration required by the reference amplifier unit for amplifying the reference signal amplitude to the predetermined value with the time duration required by the sampling unit for amplifying the sampled data signal amplitude to the predetermined value.

13. The serial data transmission system as claimed in claim 12, wherein the reference amplifier unit of the evaluation unit has a reference signal transmitter connected via a reference signal line to a reference sampling unit which samples a reference signal applied by the reference signal transmitter and amplifies the reference signal to the amplification value of the sampling unit and, upon the amplification value being reached, outputs a corresponding data signal via a data line to one input of the comparator unit, to the second input of which the data signal of the sampling unit is applied via a data line, wherein the comparator unit compares and evaluates the temporal arrival of the two data signals and outputs the evaluation result to the control unit via a data line.

14. The serial data transmission system as claimed in claim 9, wherein the evaluation unit has a reference timer unit, which outputs a reference time signal via a data line to one input of a comparator unit, to the second input of which the data signal of the sampling unit is applied via a data line, wherein the comparator unit compares and evaluates the temporal arrival of the two data signals and outputs the evaluation result to the control unit via a data line.

15. The serial data transmission system as claimed in claim 9, wherein the sampling unit has a differential amplifier and a bistable multivibrator connected downstream, wherein the differential amplifier, upon application of the sampling clock by the sampling clock generator unit differentially amplifies two data signals present at the data signal input and applies the amplified data signals to the bistable multivibrator, which switches into a stable state upon a corresponding differential voltage being reached, said stable state being applied to the evaluation circuit via a data line.

16. The serial data transmission system as claimed in claim 15, wherein the sampling clock unit applies the sampling clock to the evaluation unit simultaneously with the application to the differential amplifier, said evaluation unit then determining and evaluating the temporal delay between the application of the sampling clock and the switching operation of the multivibrator that is triggered thereby.

17. A data memory, comprising: a serial data transmission system, the serial data transmission system comprising a data transmitter for serially transmitting data signals, a data transmission path and a data receiver, the data receiver comprising:
   a sampling unit connected to a data signal input and configured to sample a data signal amplitude and amplify the sampled data signal amplitude to a predetermined value;
   a sampling clock generator unit connected to the sampling unit and configured to predetermine a sampling clock for the sampling unit;
   an evaluation unit connected to the sampling unit and configured to determine a time duration required by the sampling unit for amplifying the sampled data signal amplitude to the predetermined value and evaluate the time duration; and
   a control unit connected to the evaluation unit and the sampling clock generator unit and configured to define the sampling clock on the basis of the evaluation of the time duration determined by the evaluation unit.

18. The data memory as claimed in claim 17, wherein the control unit and the evaluation unit minimize the time duration required by the sampling unit for amplifying the sampled data signal amplitude to the predetermined value.

19. The data memory as claimed in claim 18, wherein the control unit alters the clock length of the sampling clock of the sampling clock generator unit stepwise on the basis of the evaluation of the time duration determined by the evaluation unit, in order to minimize the time duration required by the sampling unit for amplifying the sampled data signal amplitude to the predetermined value.

20. The data memory as claimed in claim 17, wherein the evaluation unit has a reference amplifier unit connected to the sampling clock generator unit and configured to amplify a reference signal amplitude to the predetermined value, and a comparator unit configured to compare the time duration required by the reference amplifier unit for amplifying the reference signal amplitude to the predetermined value with the time duration required by the sampling unit for amplifying the sampled data signal amplitude to the predetermined value.

21. The data memory as claimed in claim 20, wherein the reference amplifier unit of the evaluation unit has a reference signal transmitter connected via a reference signal line to a reference sampling unit which samples a reference signal applied by the reference signal transmitter and amplifies the reference signal to the amplification value of the sampling unit and, upon the amplification value being reached, outputs a corresponding data signal via a data line to one input of the comparator unit, to the second input of which the data signal of the sampling unit is applied via a data line, wherein the comparator unit compares and evaluates the temporal arrival of the two data signals and outputs the evaluation result to the control unit via a data line.

22. The data memory as claimed in claim 17, wherein the evaluation unit has a reference timer unit, which outputs a reference time signal via a data line to one input of a comparator unit, to the second input of which the data signal of the sampling unit is applied via a data line, wherein the comparator unit compares and evaluates the temporal arrival of the two data signals and outputs the evaluation result to the control unit via a data line.

23. The data memory as claimed in claim 17, wherein the sampling unit has a differential amplifier and a bistable multivibrator connected downstream, wherein the differential amplifier, upon application of the sampling clock by the sampling clock generator unit differentially amplifies two data signals present at the data signal input and applies the amplified data signals to the bistable multivibrator, which switches into a stable state upon a corresponding differential voltage being reached, said stable state being applied to the evaluation circuit via a data line.

24. The data memory as claimed in claim 23, wherein the sampling clock unit applies the sampling clock to the evaluation unit simultaneously with the application to the differential amplifier, said evaluation unit then determining and evaluating the temporal delay between the application of the sampling clock and the switching operation of the multivibrator that is triggered thereby.

* * * * *